(12) United States Patent
Rubin

(10) Patent No.: US 10,770,460 B2
(45) Date of Patent: *Sep. 8, 2020

(54) VERTICAL FIELD-EFFECT TRANSISTORS FOR MONOLITHIC THREE-DIMENSIONAL SEMICONDUCTOR INTEGRATED CIRCUIT DEVICES

(71) Applicant: International Business Machines Corporation, Armonk, NY (US)

(72) Inventor: Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/741,973

(22) Filed: Jan. 14, 2020

(65) Prior Publication Data

US 2020/0152629 A1 May 14, 2020

Related U.S. Application Data

(63) Continuation of application No. 16/161,752, filed on Oct. 16, 2018, now Pat. No. 10,636,791.

(51) Int. Cl.
*H01L 27/092* (2006.01)
*H01L 29/78* (2006.01)
(Continued)

(52) U.S. Cl.
CPC ........ *H01L 27/092* (2013.01); *H01L 21/0337* (2013.01); *H01L 21/8221* (2013.01);
(Continued)

(58) Field of Classification Search
CPC combination set(s) only.
See application file for complete search history.

(56) References Cited

U.S. PATENT DOCUMENTS 5,872,025 A    2/1999  Cronin et al.
8,716,091 B2   5/2014  Cohen et al.
(Continued)

OTHER PUBLICATIONS

Martin Van Den Brink, "Monolithic 3D—The Most Effective Path for Future IC Scaling," IEEE International Solid-State Circuits Conference Digest of Technical Papers (ISSCC) and SemiconWest, Feb. 17-21, 2013, 37 pages.
(Continued)

*Primary Examiner* — Ratisha Mehta
(74) *Attorney, Agent, or Firm* — Vazken Alexanian; Ryan, Mason & Lewis, LLP

(57) ABSTRACT

Devices and methods are provided for fabricating vertical field-effect transistor devices for monolithic three-dimensional semiconductor integrated circuit devices. A semiconductor structure is formed to include a substrate and a stack of layers formed on the substrate including a first active semiconductor layer, an insulating layer, and a second active semiconductor layer. A vertical fin structure is formed by patterning the first and second active semiconductor layers and the insulating layer, wherein the vertical fin structure includes first and second vertical semiconductor fins, and an insulating fin spacer disposed between the first and second vertical semiconductor fins. The first and second vertical semiconductor fins are utilized to fabricate first and second vertical field-effect transistor devices on first and second device layers of a monolithic three-dimensional semiconductor integrated circuit device.

20 Claims, 9 Drawing Sheets

(51) Int. Cl.
    *H01L 21/033* (2006.01)
    *H01L 29/66* (2006.01)
    *H01L 29/16* (2006.01)
    *H01L 29/08* (2006.01)
    *H01L 21/8238* (2006.01)
    *H01L 21/822* (2006.01)
    *H01L 29/51* (2006.01)
    *H01L 29/49* (2006.01)

(52) U.S. Cl.
    CPC ........... *H01L 21/823864* (2013.01); *H01L 21/823885* (2013.01); *H01L 29/0847* (2013.01); *H01L 29/16* (2013.01); *H01L 29/6656* (2013.01); *H01L 29/66666* (2013.01); *H01L 29/7827* (2013.01); *H01L 29/4966* (2013.01); *H01L 29/517* (2013.01)

(56) References Cited

U.S. PATENT DOCUMENTS

| | | |
|---|---|---|
| 9,177,890 B2 | 11/2015 | Du |
| 9,659,963 B2 | 5/2017 | Cheng et al. |
| 9,680,473 B1 | 6/2017 | Anderson et al. |
| 9,947,675 B1 | 4/2018 | Balakrishnan et al. |
| 2016/0141288 A1* | 5/2016 | Weng .......... H01L 21/8258 257/192 |
| 2016/0358823 A1* | 12/2016 | Balakrishnan .......... H01L 21/823431 |

OTHER PUBLICATIONS

M. Vinet et al., "Opportunities Brought by Sequential 3D CoolCube Integration," 46th European Solid-State Device Research Conference (ESSDERC), Sep. 12-15, 2016, pp. 226-229.

L. Arnaud et al., "Fine Pitch 3D Interconnections with Hybrid Bonding Technology: from Process Robustness to Reliability," IEEE International Reliability Physics Symposium (IRPS), Mar. 11-15, 2018, 7 pages.

P. Batude et al., "3D Sequential Integration: Application-Driven Technological Achievements and Guidelines," IEEE International Electron Devices Meeting (IEDM), Dec. 2-6, 2017, 4 pages.

CEA Tech, "3D Sequential Integration: an Alternative Path Towards CMOS Scalability," Leti Process Flow, SIAM Journal on Scientific Computing (SISC), 2014, 104 pages.

H. Wei et al., "Cooling Three-Dimensional Integrated Circuits Using Power Delivery Networks," International Electron Devices Meeting (IEDM) Paper, Circuit and Device Interaction (CDI) (Student Paper), Dec. 10-13, 2012, 4 pages.

List of IBM Patents or Patent Applications Treated as Related.

* cited by examiner

US 10,770,460 B2

VERTICAL FIELD-EFFECT TRANSISTORS FOR MONOLITHIC THREE-DIMENSIONAL SEMICONDUCTOR INTEGRATED CIRCUIT DEVICES

TECHNICAL FIELD

This disclosure generally relates to semiconductor fabrication techniques and, in particular, to methods for fabricating vertical field-effect transistor devices for monolithic three-dimensional (3D) semiconductor integrated circuit (IC) devices.

BACKGROUND

In semiconductor device manufacturing, 3D monolithic designs comprise stacked layers of devices (e.g., field-effect transistor (FET) devices) that are sequentially processed to reduce a device footprint. For example, a FET-over-FET integration scheme is one form of 3D monolithic integration in which p-type and n-type FET devices are separately formed on different device layers of a 3D monolithic semiconductor IC device. The separation of p-type and n-type FET devices provides certain advantages such as the ability to use more optimal or compatible semiconductor materials (e.g., germanium, silicon-germanium, silicon, group III-V compound semiconductor materials, etc.) on different layers to enhance or otherwise optimize device performance.

Monolithic 3D semiconductor IC devices are fabricated using one of various conventional methods. For example, one conventional process involves fabricating a lower device layer with FET devices, and then bonding a semiconductor substrate (e.g., pristine silicon layer or silicon-on-insulator (SOI) substrate) to the lower device layer, followed by upper layer device processing to fabricate FET devices on the semiconductor substrate and connections to the lower device layer. This conventional scheme is problematic as it requires fine lithographic alignment of the devices and connections between the upper and lower device layers.

SUMMARY

Embodiments of the invention include methods for fabricating vertical field-effect transistor devices for monolithic 3D semiconductor IC devices.

In one embodiment, a method for fabricating a semiconductor device comprises: forming a semiconductor structure comprising a first substrate, a first active semiconductor layer disposed on the first substrate, an insulating layer disposed on the first active semiconductor layer, and a second active semiconductor layer disposed on the insulating layer; forming a vertical fin structure by patterning the first and second active semiconductor layers and the insulating layer, wherein the vertical fin structure comprises a stacked structure comprising a first vertical semiconductor fin, a second vertical semiconductor fin, and an insulating fin spacer disposed between the first and second vertical semiconductor fins; forming a sacrificial layer of insulating material on the first substrate to encapsulate the first vertical semiconductor fin in sacrificial insulating material; forming a second device layer over the sacrificial layer of insulating material, wherein the second device layer comprises a vertical field-effect transistor device which comprises the second vertical semiconductor fin; bonding a second substrate to the second device layer; removing the first substrate to expose the sacrificial layer of insulating material; removing the sacrificial layer of insulating material to expose the first vertical semiconductor fin; and forming a first device layer over second device layer, wherein the first device layer comprises a vertical field-effect transistor device which comprises the first vertical semiconductor fin.

Another embodiment includes a method for fabricating a semiconductor device which comprises: forming a stacked structure comprising a first substrate, an etch stop layer disposed on the first substrate, a first hardmask layer disposed on the etch stop layer, a first active semiconductor layer disposed on the first hardmask layer, an insulating layer disposed on the first active semiconductor layer, a second active semiconductor layer disposed on the insulating layer, and a second hardmask layer disposed on the second active semiconductor layer; patterning the first hard mask layer, the first active semiconductor layer, the insulating layer, the second active semiconductor layer, and the second hard mask layer to form a vertical fin structure, the vertical fin structure comprising a first hard mask capping layer, a first vertical semiconductor fin, an insulating fin spacer, a second vertical semiconductor fin, and a second hard mask capping layer; forming a sacrificial layer of insulating material on the first substrate to encapsulate the first hard mask capping layer and the first vertical semiconductor fin in sacrificial insulating material; forming a second device layer over the sacrificial layer of insulating material, wherein the second device layer comprises a vertical field-effect transistor device which comprises the second vertical semiconductor fin; bonding a second substrate to the second device layer; removing the first substrate to expose the etch stop layer; removing the etch stop layer and the sacrificial layer of insulating material to expose the first hard mask capping layer and the first vertical semiconductor fin; and forming a first device layer over second device layer, wherein the first device layer comprises a vertical field-effect transistor device which comprises the first vertical semiconductor fin.

Another embodiment includes a semiconductor device. The semiconductor device comprises: a first substrate comprising an etch stop layer disposed on a surface of the first substrate; a vertical fin structure disposed on the etch stop layer, wherein the vertical fin structure comprises a first hard mask capping layer disposed on the etch stop layer, a first vertical semiconductor fin disposed on the first hard mask capping layer, an insulating fin spacer disposed on the first vertical semiconductor fin, a second vertical semiconductor fin disposed on the insulating fin spacer, and a second hard mask capping layer disposed on the second vertical semiconductor fin; a sacrificial layer of insulating material disposed on the etch stop layer and encapsulating the first hard mask capping layer and the first vertical semiconductor fin of the vertical fin structure in sacrificial insulating material; and a second device layer disposed on the sacrificial layer of insulating material, wherein the second device layer comprises a vertical field-effect transistor device which comprises the second vertical semiconductor fin.

Other embodiments will be described in the following detailed description of embodiments, which is to be read in conjunction with the accompanying figures.

BRIEF DESCRIPTION OF THE DRAWINGS

FIGS. 1 through 9 schematically illustrate a method for fabricating vertical field-effect transistor devices for monolithic 3D semiconductor integrated circuit devices, according to an embodiment of the invention, wherein:

FIG. 1 is a schematic cross-sectional view of a semiconductor device structure at an intermediate stage of fabrication comprising a stack structure comprising active semiconductor layers for first and second device layers which are separated by dielectric layers;

FIG. 2 is a schematic cross-section side view of the semiconductor device structure of FIG. 1 after patterning the stack structure to form a plurality of vertical fin structures;

FIG. 3 is a schematic cross-sectional side view of the semiconductor device structure of FIG. 2 after forming a sacrificial insulating layer for the first device layer to encapsulate portions of the vertical fin structures comprising vertical semiconductor fins and associated hard mask capping layers of the first device layer in the sacrificial insulating layer;

FIG. 4 is a schematic cross-sectional side view of the semiconductor device structure of FIG. 3 after forming a thin capping layer on the sacrificial insulating layer;

FIG. 5 is a schematic cross-sectional side view of the semiconductor device structure of FIG. 4 after forming a vertical FET device for the second device layer and encapsulating the vertical FET device in a layer of insulating material;

FIG. 6 is a schematic cross-sectional view of the semiconductor device structure of FIG. 5 after bonding the semiconductor device structure of FIG. 5 face down to a second substrate;

FIG. 7 is a schematic cross-sectional side view of the semiconductor device structure of FIG. 6 after removing a first substrate to expose the first device layer;

FIG. 8 is a schematic cross-sectional side view of the semiconductor device structure of FIG. 7 after removing an etch stop layer and the sacrificial insulating layer of the first device layer; and FIG. 9 is a schematic cross-sectional side view of the semiconductor device structure of FIG. 8 after forming a vertical FET device for the first device layer and encapsulating the vertical FET device in a layer of insulating material.

DETAILED DESCRIPTION

Figure 1:
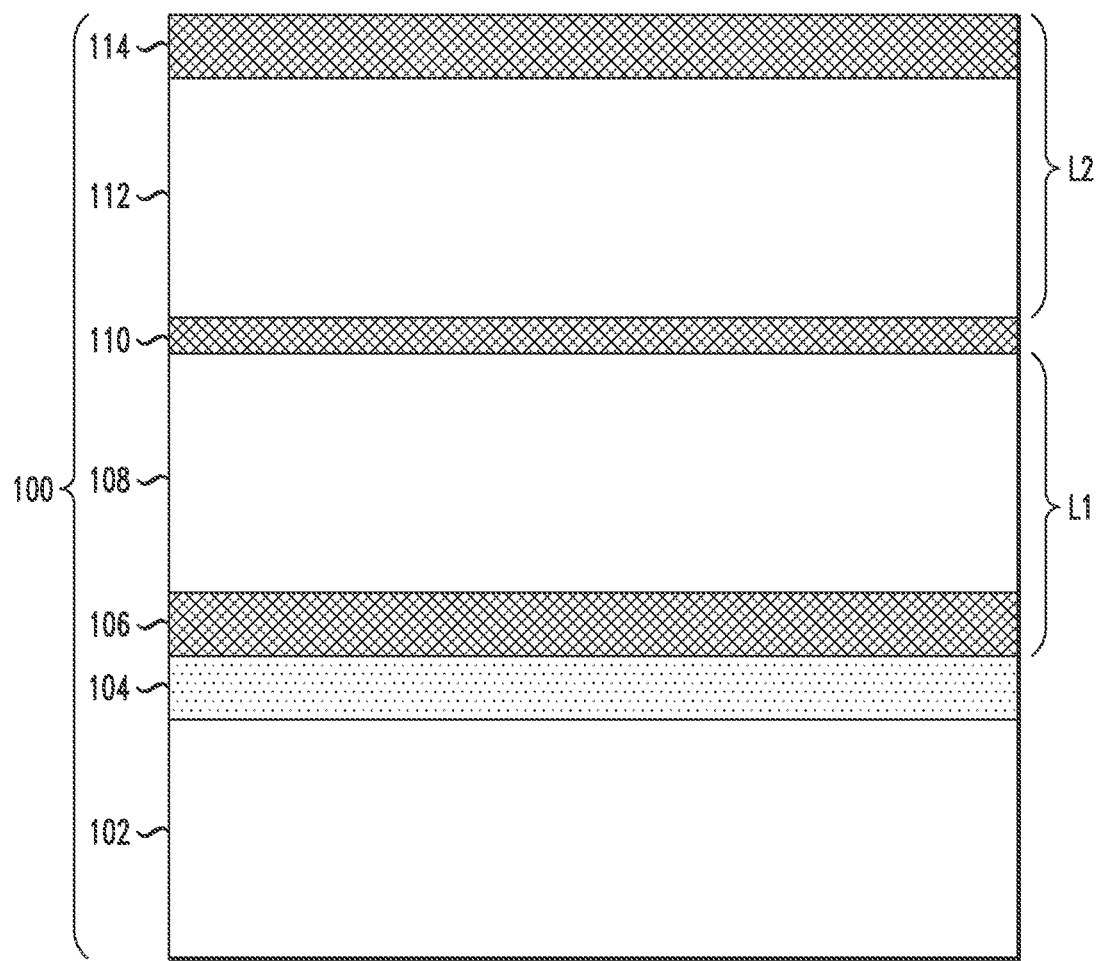

Embodiments will now be described in further detail with regard to methods for fabricating vertical field-effect transistor devices for monolithic 3D semiconductor IC devices. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context, XYZ Cartesian coordinates are shown in the drawings of semiconductor device structures. It is to be understood that the term "vertical" as used herein denotes a Z-direction of the Cartesian coordinates shown in the drawings, and that the terms "horizontal" or "lateral" as used herein denote an X-direction and/or a Y-direction of the Cartesian coordinates shown in the drawings, which is perpendicular to the Z-direction.

FIGS. 1 through 9 schematically illustrate a method for fabricating vertical field-effect transistor devices for monolithic 3D semiconductor integrated circuit devices, according to an embodiment of the invention. To begin, FIG. 1 is a schematic cross-sectional view (X-Z plane) of a semiconductor device 10 at an intermediate stage of fabrication comprising a stack structure 100 comprising active semiconductor layers separated by dielectric layers. In particular, the stack structure 100 comprises a substrate 102, an etch stop layer 104, a first hard mask layer 106, a first active semiconductor layer 108, an insulating layer 110, a second active semiconductor layer 112, and a second hard mask layer 114. In one embodiment, the substrate 102 comprises a silicon wafer, which provides a first substrate (or starting substrate) on which the upper layers in the stack 100 are deposited and/or bonded and transferred. In one embodiment, the etch stop layer 104 comprises a silicon oxide layer. In other embodiments, the etch stop layer 104 can be formed of multiple layers of different materials, a doped epitaxial semiconductor layer, or any other types of materials which provide etch selectivity for a subsequent etch process step (as discussed below) in which the etch stop layer 104 serves as a backside etch stop layer.

In one embodiment, the first hard mask layer 106 and the first active semiconductor layer 108 form part of a first device layer L1, and the second silicon layer 112 and the second hard mask layer 114 form part of a second device layer L2. The insulating layer 110 insulates the first and second active semiconductor layers 108 and 112 of the first and second device layers L1 and L2. In one embodiment, the first hardmask layer 106, the insulating layer 110, and the second hard mask layer 114 are formed of silicon nitride. In other embodiments, the first hardmask layer 106, the insulating layer 110, and the second hard mask layer 114 can be formed of different dielectric materials, or multilayer stacks of materials, etc., which are suitable for the given application to provide etch selectivity during subsequent fabrication steps, as discussed below.

The stack structure 100 can be fabricated using known semiconductor fabrication techniques and suitable semiconductor materials, as is readily understood by one of ordinary skill in the art. For example, in one embodiment, the first substrate 102 may comprise a semiconductor wafer (e.g., silicon wafer) on which a silicon oxide layer can be deposited or chemically grown to form the etch stop layer 104. In an alternate embodiment, as noted above, the etch stop layer 104 can be a doped epitaxial semiconductor layer that is grown on the surface of the substrate 102. The first hardmask layer 106 can be deposited on the etch stop layer 104 using known methods.

In one embodiment, the first and second active semiconductor layers 108 and 112 comprise silicon layers. In other embodiments, the first and second active semiconductor layers 108 and 112 can be formed with other types of semiconductor materials, such as silicon-germanium (SiGe) alloys, III-V compound semiconductor materials, etc. In one example embodiment, the first active semiconductor layer 108 can be a silicon layer, and the second active semiconductor layer 112 can be SiGe layer, or vice versa. The types of semiconductor materials used for the first and second active semiconductor layers 108 and 112 can be selected, for example, depending on the types of FET devices (N-type or P-type) which are formed for the different device layers for a given FET-over-FET integration scheme.

In one embodiment, the first active semiconductor layer 108 can be a bulk silicon wafer that is bonded to the first hard mask layer 106 (e.g., SiN layer) using any suitable wafer bonding method for bonding a Si wafer to a SiN layer. The insulating layer 110 is formed by deposing a layer of SiN material on a surface of the first active semiconductor layer 108, wherein the insulating layer 110 can be formed on the active semiconductor layer 108 either before or after bonding the first silicon layer 108 to the first substrate 102. The second active semiconductor layer 112 can be a bulk silicon wafer that bonded to the insulating layer 110 using Si-to-SiN wafer bonding methods. The second hard mask layer 114 is formed on the second active semiconductor layer 112 either before or after bonding the second active semiconductor layer 112 to the first active semiconductor layer 108.

Other methods can be utilized to fabricate the intermediate stack structure 100 of FIG. 1. For example, the first active semiconductor layer 108 can be transferred to the stack structure of FIG. 1 from a semiconductor-on-insulator (SOI) wafer. An SOI wafer comprises a layer of crystalline semiconductor material (e.g., crystalline silicon) which is separated from a bulk substrate of the SOI wafer by a thin layer of insulating material (e.g., buried oxide layer). In this instance, the first active semiconductor layer 108 could be the crystalline semiconductor layer (e.g., silicon layer) of an SOI wafer, which is bonded to the first hard mask layer 106, followed by backside grind and etch processes to remove the bulk substrate and buried oxide layer of the SOI wafer. Similarly, the second active semiconductor layer 112 can be a layer of semiconductor material that is transferred to the stack structure of FIG. 1 from an SOI wafer.

Figure 2:
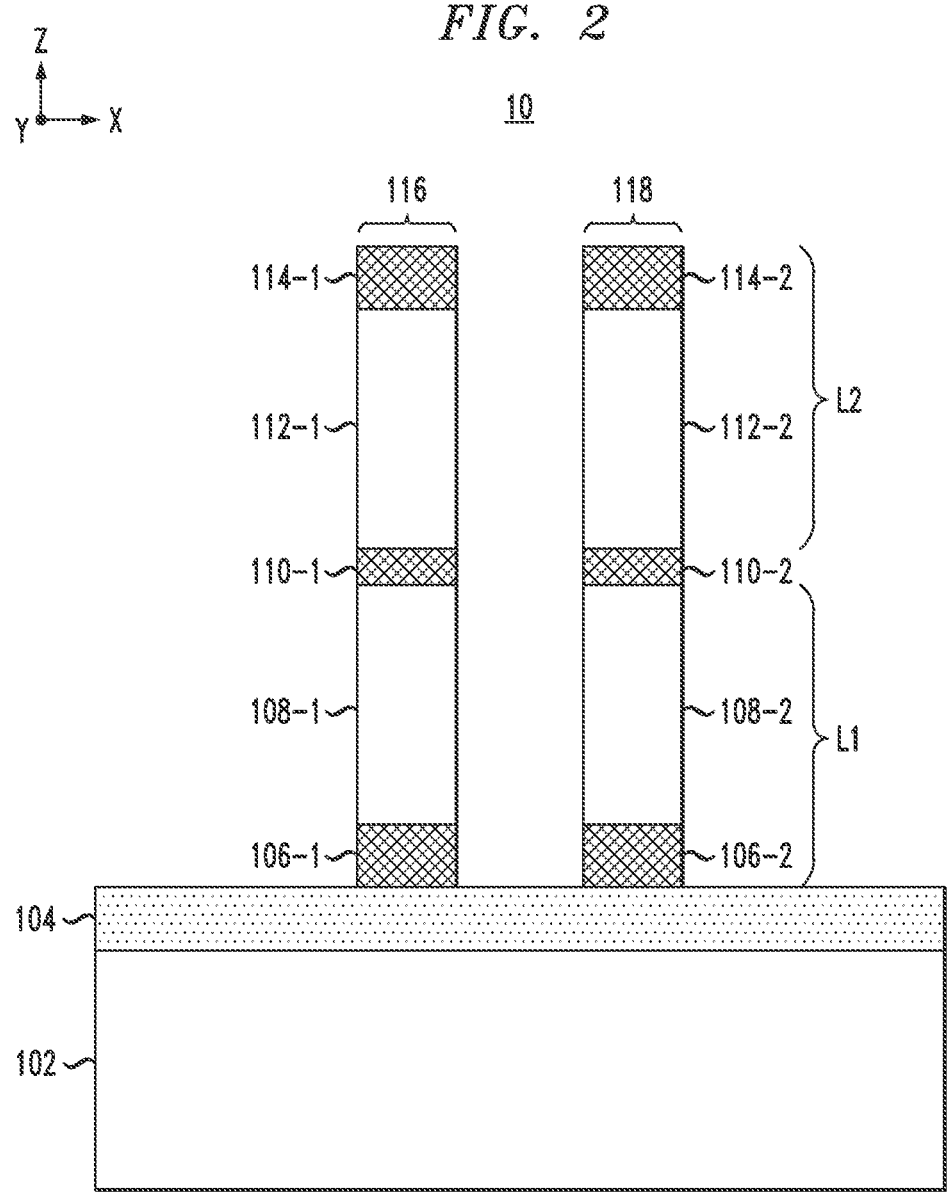

Next, FIG. 2 is a schematic cross-section side view of the semiconductor device structure shown in FIG. 1 after patterning the stack structure 100 to form a plurality of vertical fin structures 116 and 118. In one embodiment, the vertical fin structures 116 and 118 are formed by etching the second hard mask layer 114, the second active semiconductor layer 112, the insulating layer 110, the first active semiconductor layer 108 and the first hard mask layer 106 down to the etch stop layer 104. In one embodiment, the patterning process can be implemented forming an etch mask using photolithography, followed by or more directional dry etch processes (e.g., deep reactive ion etch (DRIE) process) to etch the stacked layers and form the vertical fin structures 116 and 118. In other embodiments, multi-patterning photolithography techniques can be utilized to form the vertical fin structures 116 and 118. Such multi-patterning techniques include, but are not limited to, sidewall image transfer (SIT), and self-aligned doubled patterning (SADP) techniques, etc.

In the embodiment shown in FIG. 2, the etch process results in concurrently forming vertical semiconductor fins 112-1 and 112-2 for the second (upper) device layer L2 and vertical semiconductor fins 108-1 and 108-2 for the first (lower) device layer L2, as well as corresponding upper hard mask capping layers 114-1 and 114-2, and lower hard mask capping layers 106-1 and 106-2 of the vertical fin structures 116 and 118. In addition, the etch process results in the formation of semiconductor fin insulating spacers 110-1 and 110-2 which serve to insulate the lower vertical semiconductor fins 108-1 and 108-2 from the upper vertical semiconductor fins 112-1 and 112-2.

Figure 3:
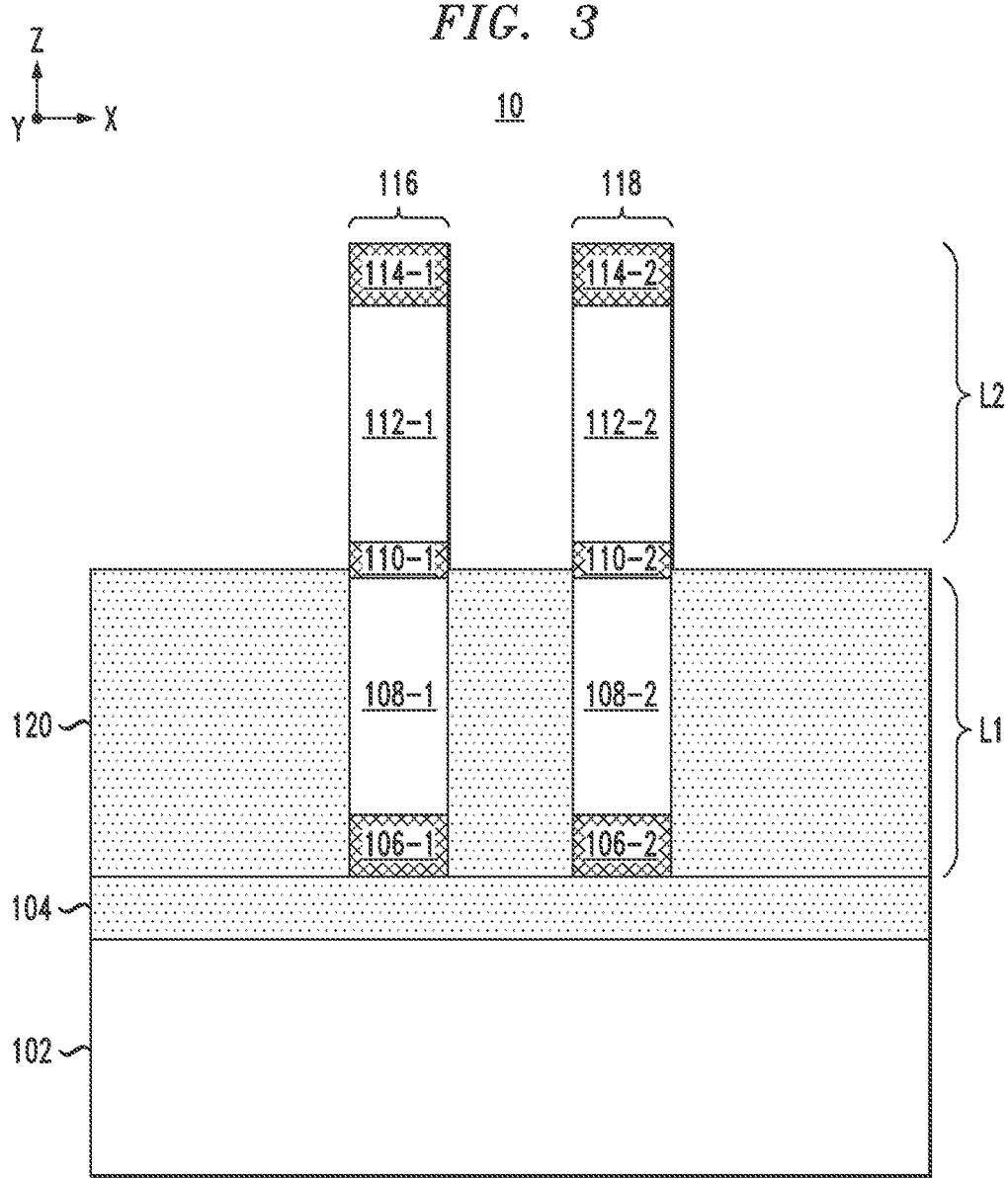

Next, FIG. 3 is a schematic cross-sectional side view of the semiconductor device structure of FIG. 2 after forming a sacrificial insulating layer 120 for the first device layer L1 to encapsulate the vertical semiconductor fins 108-1 and 108-2 and associated hard mask capping layers 106-1 and 106-2 of the first device layer L1 in a layer of sacrificial insulating material. In one embodiment, the insulating layer comprises an oxide material (e.g., silicon dioxide) which is formed using known methods. For example, in one embodiment, the sacrificial insulating layer 120 is formed by blanket depositing a layer of insulating material (e.g., silicon oxide) to cover the exposed upper portions of the vertical fin structures 116 and 118, and then planarizing the layer of insulating material down to an upper surface of the hard mask capping layers 114-1 and 114-2. An etch back process is then performed to recess the insulating material down to a level of the semiconductor fin insulating spacers 110-1 and 110-2. The recess process can be performed using a timed anisotropic dry etch process to etch the sacrificial insulating material selective to the material of the hard mask capping layer 114-1 and 114-2, and thereby form the sacrificial insulating layer 120.

In another embodiment, prior to forming the sacrificial insulating layer 120, a thin insulating (protective) liner layer can be formed to cover the sidewalls of the vertical fin structures 116 and 118. The thin liner layer would serve to protect the vertical semiconductor fins 108-1, 108-2, 112-1, and 112-2 during subsequent processing stages (e.g., frontside and backside recessing of oxide layers). The thin insulating liner layer could be formed by conformally depositing a layer of dielectric material (e.g., nitride), followed by a directional dry etch process to remove portions of the conformal layer of dielectric material from the lateral surfaces of the semiconductor device structure. The liner layer on the vertical sidewalls of the vertical semiconductor fins 112-1 and 112-2 would protect the semiconductor material of the vertical semiconductor fins 112-1 and 112-2 during the etch back process to form the sacrificial insulating layer 120 shown in FIG. 3. The protective liner is stripped away at some later stage of fabrication.

Figure 4:
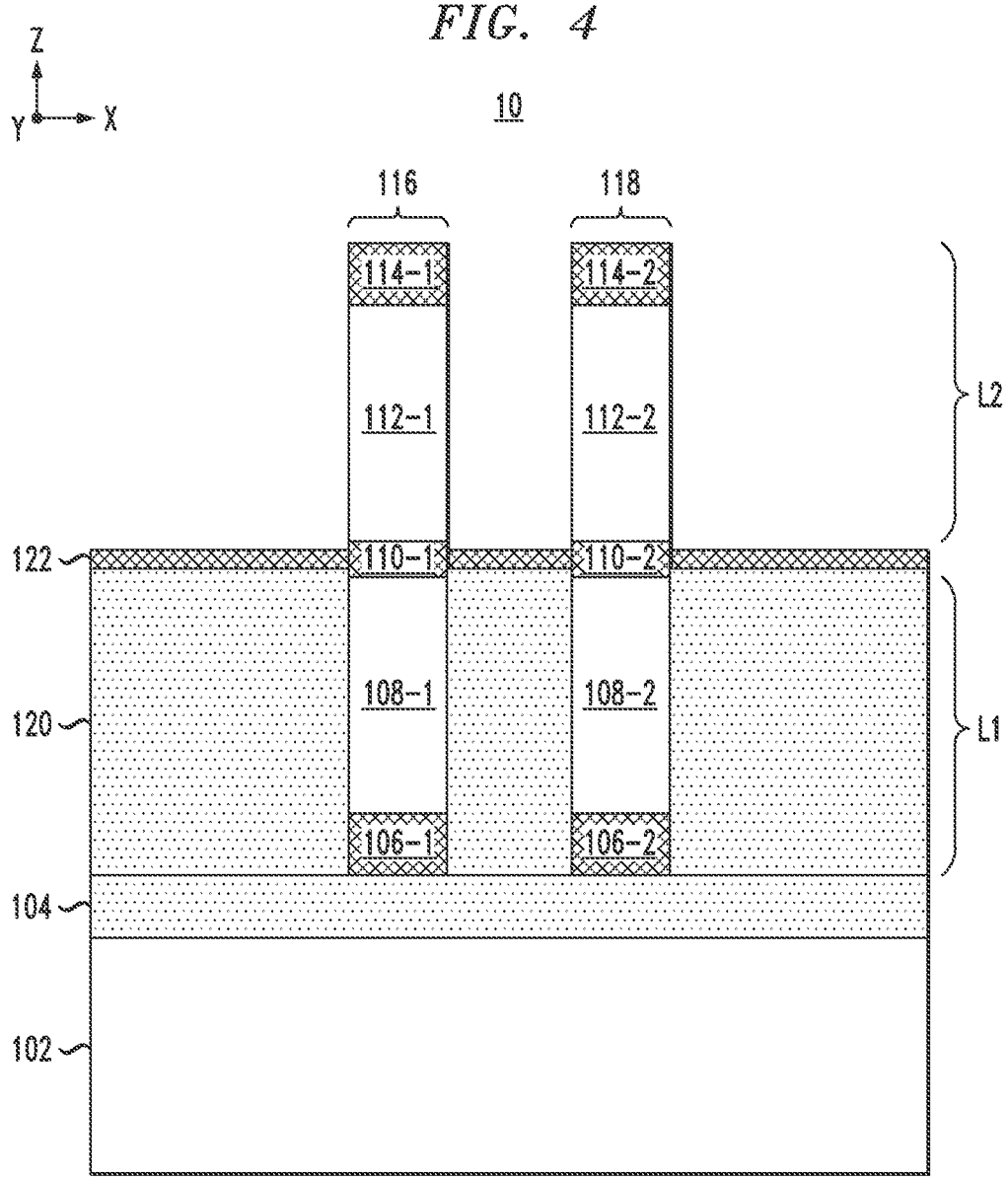

Next, FIG. 4 is a schematic cross-sectional side view of the semiconductor device structure of FIG. 3 after forming a thin capping layer 122 on the sacrificial insulating layer 120. In one embodiment, the thin capping layer 122 is formed of a material which has etch selectivity with respect to the material of the sacrificial insulating layer 120. For example, in one embodiment, the thin capping layer 122 is formed of a nitride (e.g., SiN). The thin capping layer 122 can be formed by an anisotropic deposition process in which SiN material is only, or primarily, deposited on exposed lateral surfaces, and not on vertical surfaces. In this instance, an additional thin layer of SiN material may be deposited on the upper surfaces of the hard mask capping layers 114-1 and 114-2, but not on the exposed vertical sidewalls of the vertical semiconductor fins 112-1 and 112-2.

Figure 5:
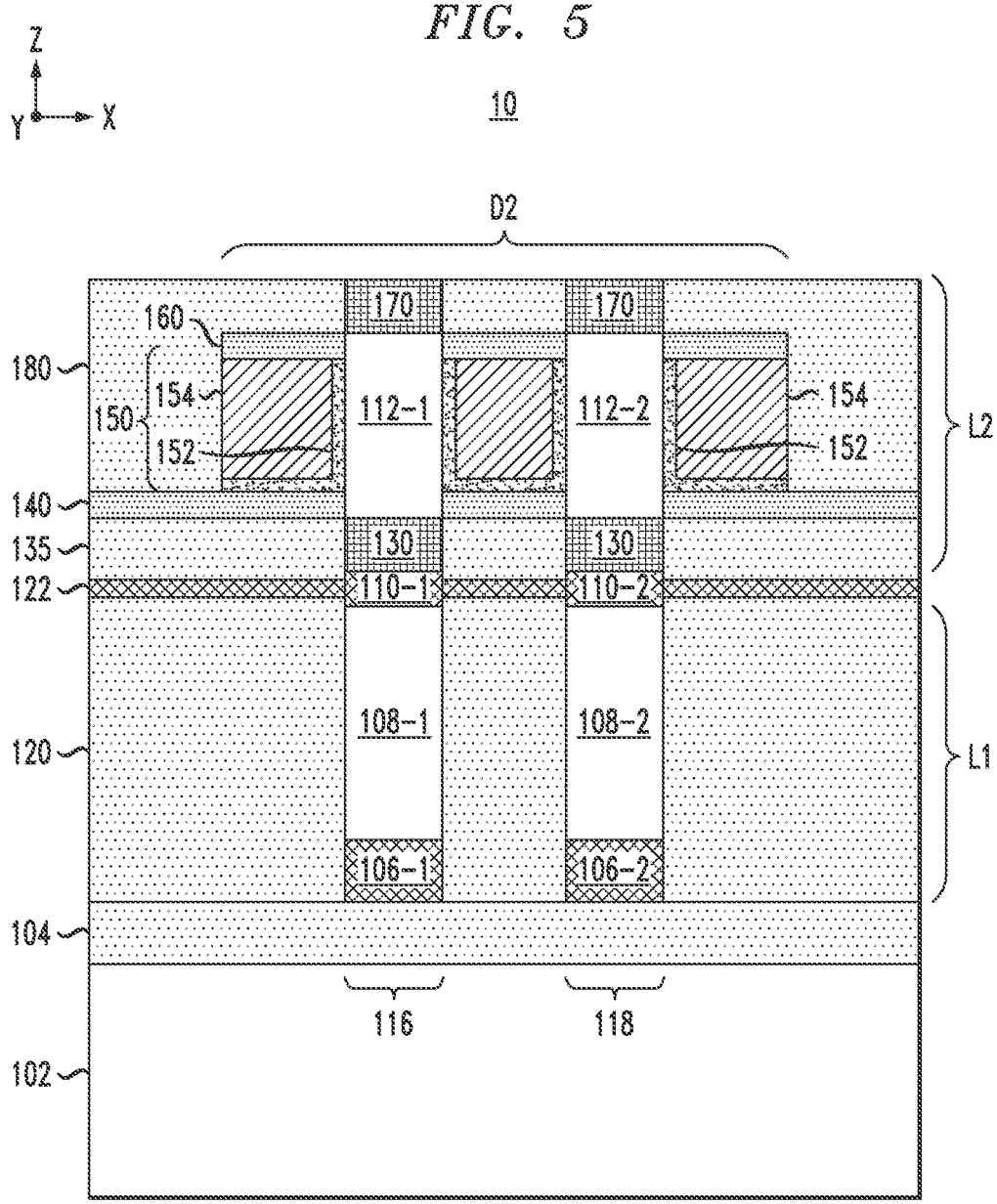

A next phase of the fabrication process comprises forming vertical FET devices for the second (upper) device layer L2. For example, FIG. 5 is a schematic cross-sectional side view of the semiconductor device structure of FIG. 4 after forming a vertical FET device D2 for the second device layer L2 and encapsulating the vertical FET device D2 in a layer of insulating material 180. The vertical FET device D2 comprises first (lower) source/drain regions 130 formed in a lower region of the vertical semiconductor fins 112-1 and 112-2, a wrap-around source/drain contact 135 in contact with the lower source/drain regions 130, a lower insulating spacer 140, a metal gate structure 150 comprising a gate dielectric layer 152 and a metallic gate electrode 154, an upper insulating spacer 160, and second (upper) source/drain regions 170 formed on upper surfaces of the vertical semiconductor fins 112-1 and 112-2. The vertical FET device D2 can be fabricated using known techniques.

For example, in one embodiment, the lower source/drain regions 130 are formed by depositing a dopant-rich layer on the nitride capping layer 122 which surrounds bottom regions of the vertical semiconductor fins 112-1 and 112-2, and which has a thickness which defines a desired vertical height or thickness of the lower source/drain regions 130. A thermal diffusion process is then performed to cause dopants of the dopant-rich layer to diffuse into the bottom regions of the vertical semiconductor fins 112-1 and 112-2 to form the lower source/drain regions 130. For a p-type FET, the dopant-rich layer can be formed of a material having p-type impurities (e.g., boron), and for an n-type FET, the dopant-rich layer may comprise n-type impurities (e.g., phosphorus, arsenic, etc.). In one embodiment, the dopant-rich layer can be phosphosilicate glass (PSG) layer, or a boro-silicate-glass (BSG) layer.

During a subsequent stage of fabrication, the dopant rich layer can be removed by etching an opening through the insulating layer 180 and the lower spacer 140 down to the dopant rich layer, wherein the dopant-rich layer is then selectivity removed using an isotropic wet etch process which etches the dopant-rich layer selective to the lower spacer layer 140 and the nitride capping layer 122. The space or void which remains after removing the dopant-rich layer is then filled with a metallic material to form a wrap-around source/drain contact layer which surrounds and is in contact with the lower source/drain regions 130.

In another embodiment, source/drain regions can be formed by growing doped epitaxial films on the lower portions of the vertical semiconductor fins 112-1 and 112-2 using any suitable method. The doped epitaxial films can be grown to merge the epitaxial material between the vertical semiconductor fins 112-1 and 112-2. A thin sacrificial layer can then be formed in the source/drain region, which subsequently can be selectively removed to form a space or void, which is then filled with a metallic material to form a wrap-around source/drain contact layer which surrounds and is in contact with the epitaxially grown source/drain layers on the bottom portions of the vertical semiconductor fins 112-1 and 112-2.

In one embodiment, the source/drain regions can be formed using a process flow as follows. The process begins by removing the protective liner layers on the sidewalls of the vertical semiconductor fins 112-1 and 112-2, which were previously formed to protect the vertical semiconductor fins 112-1 and 112-2 during the formation of the sacrificial insulating layer 120. A second sacrificial insulating layer is then formed on the thin capping layer 122 with a sufficient thickness which covers a bottom portion of the vertical semiconductor fins 112-1 and 112-2 on which the epitaxial source/drain layers are to be grown. Another protective liner layer is then conformally deposited and patterned to form a protective liner on the exposed sidewall surfaces of the vertical semiconductor fins 112-1 and 112-2 above the surface of the second sacrificial insulating layer, while removing the lateral portions of the conformal liner layer on the surface of the second insulating layer. Then, the second sacrificial insulating layer is selectively removed to expose the bottom surfaces of the vertical semiconductor fins 112-1 and 112-2 which are not covered by the protective liner layer. An epitaxial deposition process is then performed using known methods to grow epitaxial source/drain layers on the exposed bottom surfaces of the vertical semiconductor fins 112-1 and 112-2.

The lower insulating spacer 140 is formed by depositing a layer of dielectric material such as $SiO_2$, SiN, SiBCN or SiOCN, or some other type of low-k dielectric material that is commonly used to form insulating spacers for vertical FET devices. The lower insulating spacer 140 may be formed using a directional deposition process in which the dielectric/insulating material is directly deposited on lateral surfaces, or by blanket depositing the dielectric/insulating material followed by planarizing and recessing the dielectric/insulating material, using well-known deposition and etching techniques. The lower insulating spacer 140 serves to insulate the gate structures 150 from the lower source/drain regions 130 and the wrap-around source/drain contact layer.

In one embodiment, the gate structure 150 comprises a high-k metal gate structure which comprises the high-k gate dielectric layer 152 formed on exposed portions of the vertical semiconductor fins 112-1 and 112-2. In the exemplary embodiment of FIG. 5, the gate structure 150 comprises a common gate structure that surrounds vertical sidewalls of both vertical semiconductor fins 112-1 and 112-2. In this regard, in one embodiment, the vertical FET device D2 comprises a multi-fin FET device, wherein the vertical FET device D2 is formed of a plurality of vertical FET device segments that are connected in parallel, as is understood by one of ordinary skill in the art. In other embodiments, individual gate structures can be formed each of the vertical semiconductor fins 112-1 and 112-2 to form separate vertical FET devices.

The gate structure 150 can be fabricated using known methods. For example, in one embodiment, the gate structure 150 is formed by depositing a conformal layer of dielectric material (which forms the gate dielectric layer 152) over the surface of the semiconductor device structure to conformally cover the lower insulating spacer 140, the sidewalls of the vertical semiconductor fins 112-1 and 112-2, and the hard mask capping layers 114-1 and 114-2. The conformal layer of dielectric material comprises a high-k dielectric material, including, but not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the conformal layer of dielectric material is formed with a thickness in a range of about 0.5 nm to about 5.0 nm (or more preferably, in a range of about 0.5 nm to about 2.5 nm), which will vary depending on the target application. The conformal layer of dielectric material is deposited using known methods such as atomic layer deposition (ALD), for example, which allows for high conformality of the gate dielectric material.

In another embodiment, a thin conformal layer of work function metal (WFM) may be deposited over the conformal layer of dielectric material prior to depositing a layer of conductive material which forms the gate electrode 154. In this regard, in one embodiment, the gate dielectric layer 152 shown in FIG. 5 would comprise a high-k gate stack structure comprising a thin conformal layer of dielectric material and a thin conformal WFM layer. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, chemical vapor deposition (CVD), etc. In one embodiment, the conformal WFM layer is formed with a thickness in a range of about 2 nm to about 5 nm.

Next, a layer of conductive material (gate electrode layer) is deposited over the conformal layer of dielectric material. In one embodiment, the layer of conductive material is formed by depositing a metallic material such as tungsten, or any other suitable metallic material such as titanium, tantalum, ruthenium, zirconium, cobalt, copper, aluminum, lead, platinum, tin, silver, gold, etc. In other embodiments, the layer of conductive material may be a conductive material including, but not limited to, a doped semiconductor material (e.g., polycrystalline or amorphous silicon, germanium, silicon germanium, etc.), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, plasma-enhanced CVD (PECVD), physical vapor deposition (PVD), plating, thermal or e-beam evaporation, sputtering, etc. In another embodiment, the layer of conductive material can serve as a WFM layer, in which case a separate conformal WFM layer is not deposited over the conformal layer of dielectric material prior to depositing the layer of conductive material.

Next, a planarizing process is performed to planarize the surface of the semiconductor device structure down to the hard mask capping layers 114-1 and 114-2 (on top of the vertical semiconductor fins 112-1 and 112-2) to remove the overburden dielectric and metallic material. A recess process is then performed using a directional dry etch process (e.g., RIE) to recess the planarized surface of the layer of conductive material and the conformal layer of dielectric material down to a target depth with defines a gate length of the gate structure 150 of the vertical FET device D2. The etch process is performed to selectively etch the conductive and dielectric materials selective to the hard mask capping layers 114-1 and 114-2.

The upper insulating spacer 160 is then formed by depositing a layer of dielectric material such as $SiO_2$, SiN, SiBCN or SiOCN, or some other type of low-k dielectric material that is commonly used to form insulating spacers for vertical FET devices. In one embodiment, the upper insulating spacer 160 can be formed using a directional deposition process in which the dielectric/insulating material is directly deposited on the lateral (recessed) surfaces of the gate material.

The gate structure 150 and upper insulating spacer 160 are then formed by patterning the upper insulating spacer layer and the gate stack layers (e.g., high-k dielectric material layer and metallic gate electrode material layer) using a gate cut process. In one embodiment the gate cut process comprises forming a block mask on the surface of the semiconductor device structure, and then utilizing the block mask to anisotropically etch away exposed portions of the upper insulating spacer layer and gate stack layers. In one embodiment, the block mask is formed by depositing a layer of mask material (e.g., photoresist material, or organic planarizing layer (OPL) material), and patterning the layer of mask material to form a block mask with an image that defines the gate structure 150 of the vertical FET device D2, and other vertical FET devices in the device layer L2. The block mask is formed to protect portions of the deposited insulating spacer layer and gate stack layers (e.g., high-k dielectric material layer and metallic gate electrode material layer) which are to be protected from etching. The gate cut process is then performed, for example, using a directional dry etch process (e.g., RIE) to etch down the exposed portions of the upper insulating spacer layer and the gate stack layers down to the lower insulating spacer 140, resulting in the gate structure 150 (comprising the gate dielectric layer 152 and the gate electrode 154) and the upper insulating spacer 160, as shown in FIG. 5.

Following the gate cut process, the block mask is removed, and the insulating layer 180 is formed by blanket depositing a layer of insulating/dielectric material over the surface of the semiconductor device structure, and then planarizing the layer of insulating/dielectric material down to the upper surface of the hard mask capping layers 114-1 and 114-2 on the upper portions of the vertical semiconductor fins 112-1 and 112-2. The insulating layer 180 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the insulting layer 180 is deposited using known deposition techniques, such as, for example, ALD, CVD, PECVD, PVD, or spin-on deposition.

Next, a selective etch process is performed to selectively remove the hard mask capping layers 114-1 and 114-2 and expose the upper portions of the vertical semiconductor fins 112-1 and 112-2. The hard mask capping layers 114-1 and 114-2 can be removed using any suitable dry or wet etch process with an etch chemistry that is configured to etch the hard mask capping layers 114-1 and 114-2 selective to the materials of the insulating layer 180 and the vertical semiconductor fins 112-1 and 112-2. Following removal of the hard mask capping layers 114-1 and 114-2, the upper source/drain regions 170 are epitaxially grown on the exposed upper portions of the vertical semiconductor fins 112-1 and 112-2 using known methods. For example, in one embodiment, the upper source/drain regions 170 are formed by epitaxially growing doped semiconductor layers (e.g., doped SiGe) on the exposed upper portions of the vertical semiconductor fins 112-1 and 112-2 using known selective growth techniques in which the epitaxial material is not grown on the exposed surface of the insulting layer 180. The type of epitaxial semiconductor material that is used to form the upper source/drain regions 170 will vary depending on various factors including, but are not limited to, the type of material of the vertical semiconductor fins 112-1 and 112-2, the device type (e.g., n-type or p-type) of the vertical FET device D2.

In some embodiments, the upper source/drain regions 170 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the deposited film. In an alternate embodiment, the upper source/drain regions 170 can be doped ex-situ using, for example, ion implantation, gas phase doping, plasma doping, plasma immersion ion implantation, cluster doping, infusion doping, liquid phase doping, solid phase doping, etc.

Following the formation of the intermediate semiconductor device structure shown in FIG. 5, additional processing steps can be performed at this stage of the fabrication process, including, for example, forming vertical device contacts (e.g., gate contacts, source/drain contacts, etc.) within the insulating layer 180 using standard MOL (middle of the line) process modules, forming the wrap-around source/drain contact layer 135 (as discussed above), etc. It is to be understood that the exemplary process flow described above for fabricating vertical FET devices is merely exemplary, and that other fabrication process modules can be utilized. For example, in another embodiment, the gate structures and upper source/drain layers of the vertical FET devices can be fabricated as follows.

The metal gate stack layers (high-k dielectric layer and metal layer(s)) are conformally deposited. A gate cut process is then performed to pattern the metal gate stack layers by forming a block mask and patterning the metal gate stack layers using the block mask. An interlayer dielectric (ILD) layer (e.g., insulating layer 180) is then formed by depositing and planarizing a layer of dielectric material down to the hard mask capping layers 114-1 and 114-2. At this point, portions of the patterned metal gate stack layers are disposed on the vertical sidewalls of the hard mask capping layers 114-1 and 114-2.

The hard mask capping layers 114-1 and 114-2 are then selectively removed to expose the upper surfaces of the vertical semiconductor fins 112-1 and 112-2. A gate recess process is then performed to recess the exposed portions of the metal gate stack layers (e.g., high-k dielectric and gate metal layers) which are exposed in the openings formed by removal of the hard mask capping layers 114-1 and 114-2, down to a target depth below the exposed upper surfaces of the vertical semiconductor fins 112-1 and 112-2 (wherein the target depth defines the desired gate length). Then, upper insulating spacers are formed on the recessed surfaces of the metal gate stack structures within the openings formed by the removal of the hard mask capping layers 114-1 and 114-2. The upper source/drain regions are then epitaxially grown on the exposed upper portions of the vertical semiconductor fins 112-1 and 112-2 (which extend above the upper insulating spacers), wherein the epitaxial growth process is performed to completely or partially fill the openings formed by the removal of the hard mask capping layers 114-1 and 114-2.

Figure 6:
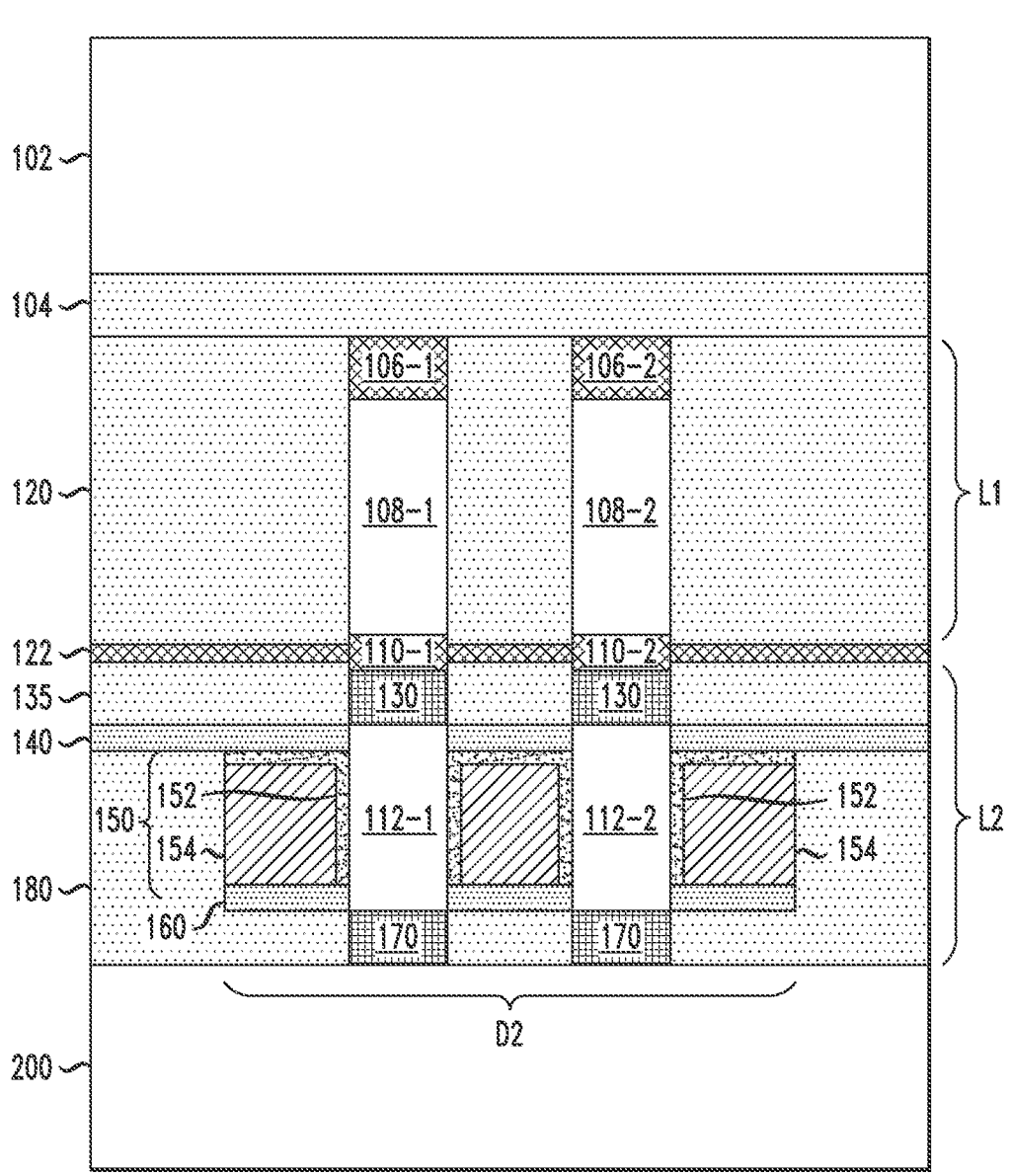

A next phase of the semiconductor fabrication process comprises forming vertical FET devices for the first device layer L1 using a process flow as schematically illustrated in FIGS. 6, 7, 8, and 9. For example, FIG. 6 is a schematic cross-sectional view of the semiconductor device structure of FIG. 5 after bonding the semiconductor device structure of FIG. 5 face down to a second substrate 200 (e.g., handle wafer). More specifically, in one embodiment, FIG. 6 schematically illustrates a temporary bonding process in which the semiconductor device structure of FIG. 5 is reversibly mounted to a second substrate 200 (or carrier substrate) using a suitable polymeric bonding technique (e.g., contact bonding or thermo-compression bonding). The second substrate 200 may comprise a glass substrate, or any type of substrate material which is suitable for the given application. The second substrate 200 and bonding mechanism are configured to mechanically support the semiconductor device structure during subsequent fabrication process modules including, for example, substrate thinning (back-grinding) and backside processing to form vertical FET devices and MOL structures for the first device layer L1.

In another embodiment, the second substrate 200 is utilized as a permanent structure (not temporary, and not removed). In this instance, the second device layer L2 will remain bonded to the wafer 200 during subsequent processing steps to complete the wiring on the first device layer L1 and package the chip in a suitable package structure. In this instance, a permanent bond is formed (e.g., oxide-oxide bond) to maintain the wafer 200 bonded to the second device layer L2, wherein a standard polymeric bonding technique may not be able to withstand the temperatures needed for front end processing of first device layer L1.

Figure 7:
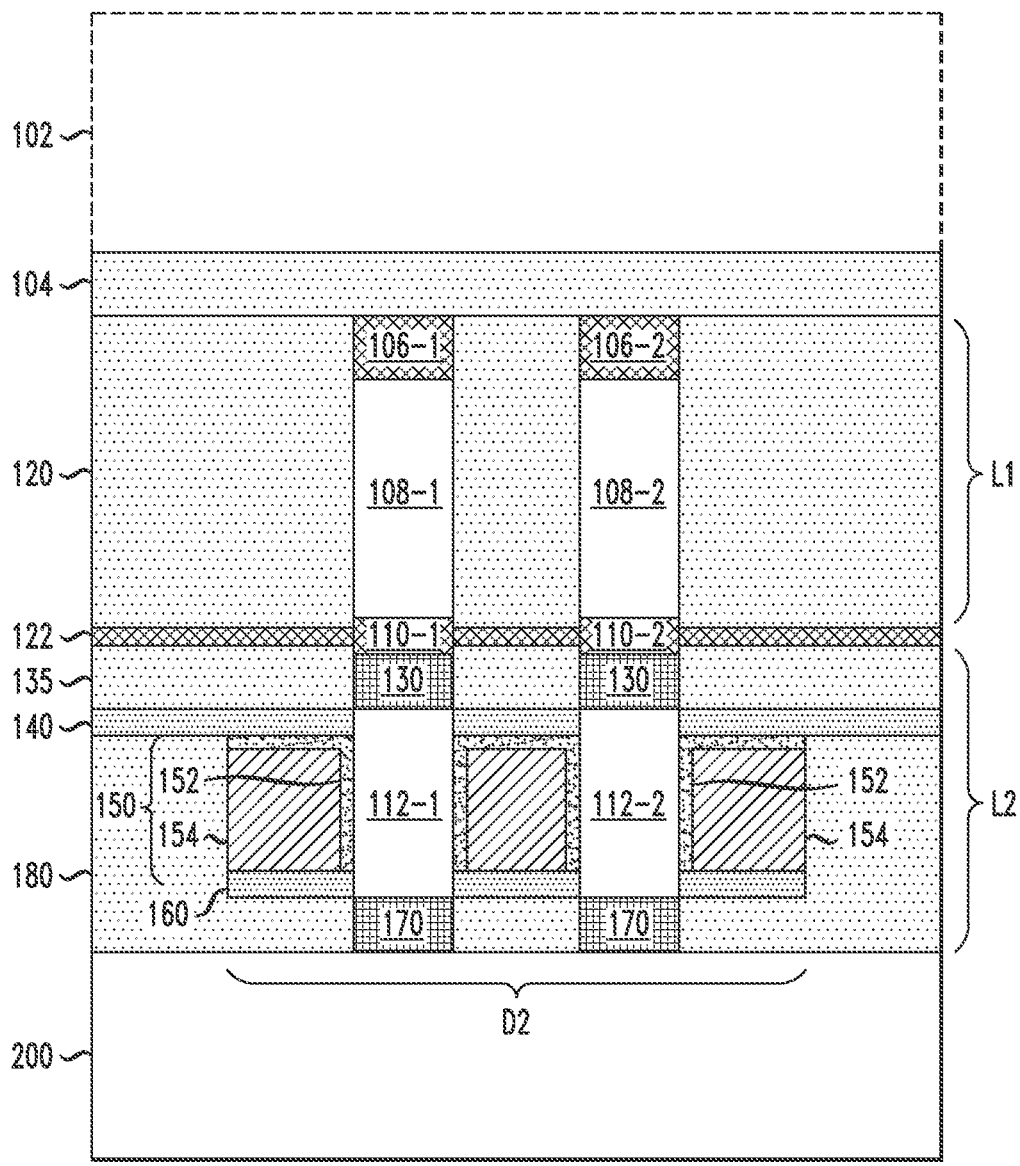

FIG. 7 is a schematic cross-sectional side view of the semiconductor device structure of FIG. 6 after removing the first substrate 102 (e.g., silicon wafer) to expose the first device layer L1. In one embodiment, the first substrate 102 is removed by a process which comprises performing a backside grinding process to remove a substantial amount of the first substrate 102, followed by a selective silicon etch process to etch away a remaining portion of the first substrate 102 selective to the backside etch stop layer 104 (e.g., oxide layer), resulting in the semiconductor device structure shown in FIG. 7.

Figure 8:
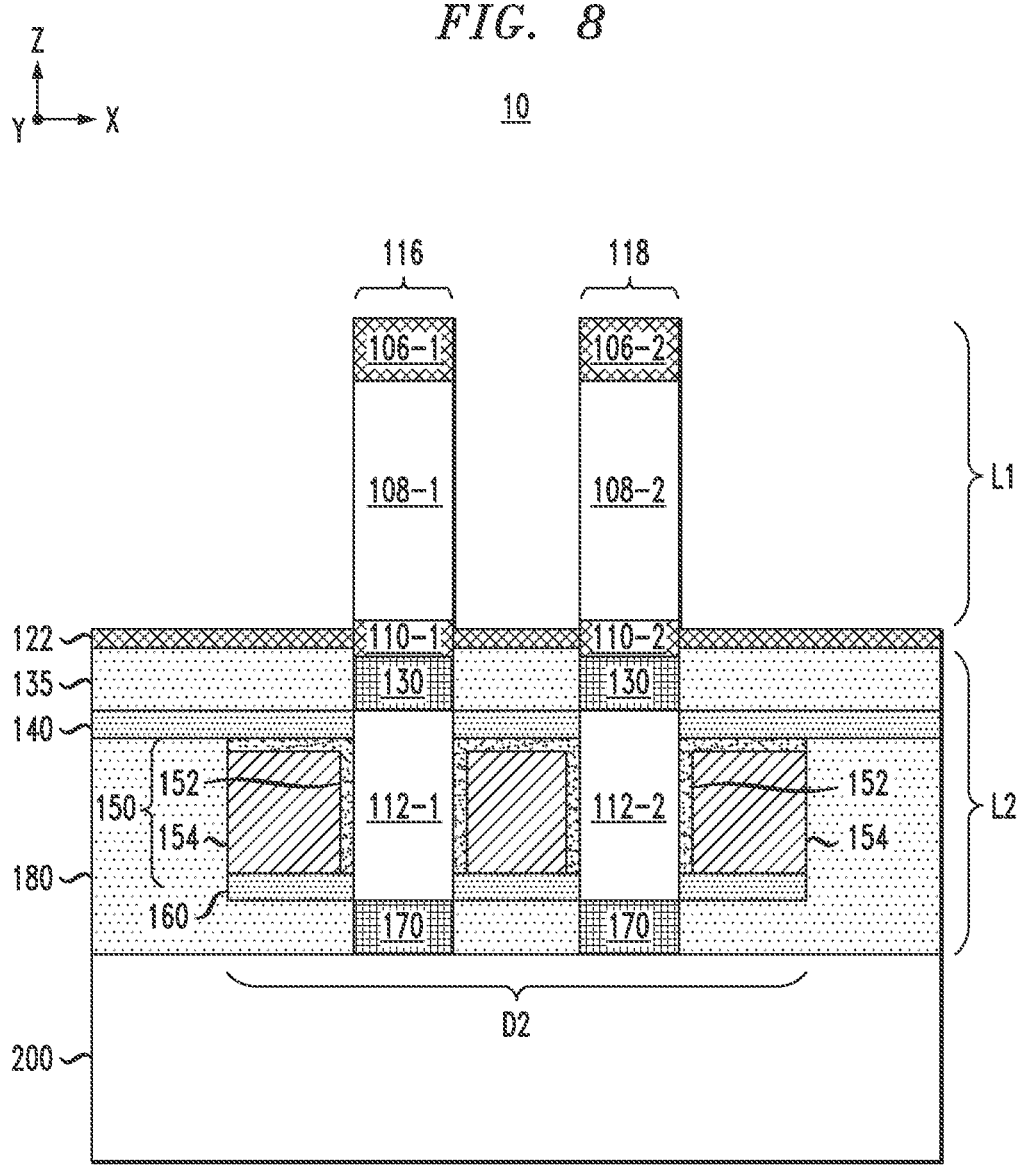

Next, FIG. 8 is a schematic cross-sectional side view of the semiconductor device structure of FIG. 7 after removing the etch stop layer 104 and the sacrificial insulating layer 120 of the first device layer L1. In one embodiment, wherein the etch stop layer 104 and the sacrificial insulating layer 120 are formed of an oxide material, the etch stop layer 104 and the sacrificial insulating layer 120 of the first device layer L1 can be removed using a single dry etch process (or a wet etch process) to etch away the etch stop layer 104 and the sacrificial insulating layer 120 selective to the hard mask capping layers 106-1 and 106-2 and the nitride capping layer 122 to expose the vertical semiconductor fins 108-1 and 108-2, resulting in the semiconductor device structure of FIG. 8. In addition, if protective liner layers were previously formed on the sidewalls of the vertical fin structures 116 and 118 (FIG. 2), such protective liner layers are removed at this stage of fabrication.

Figure 9:
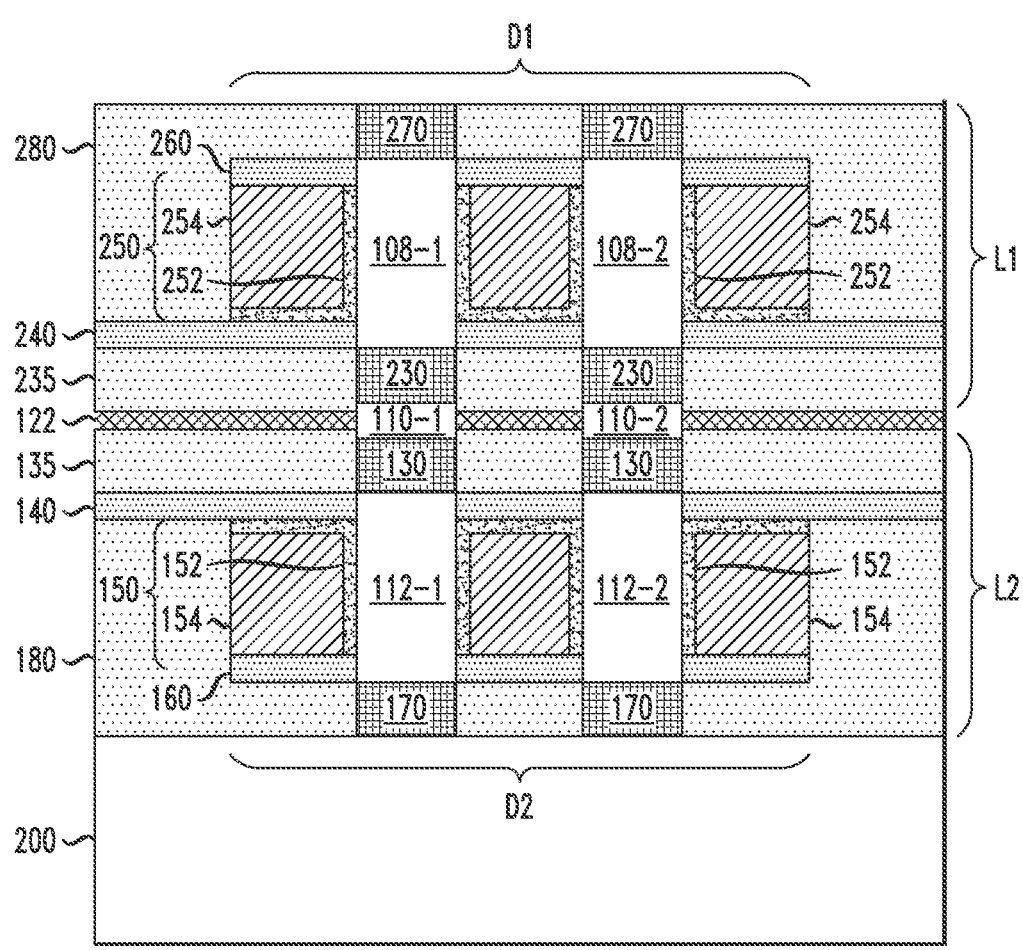

A next phase of the fabrication process comprises forming vertical FET devices for the first (lower) device layer L1. For example, FIG. 9 is a schematic cross-sectional side view of the semiconductor device structure of FIG. 8 after forming a vertical FET device D1 for the first device layer L2 and encapsulating the vertical FET device D1 in a layer of insulating material 280. The vertical FET device D1 comprises first (lower) source/drain regions 230 formed in a lower region of the vertical semiconductor fins 108-1 and 108-2, a wrap-around source/drain contact 235 in contact with the lower source/drain regions 230, a lower insulating spacer 240, a metal gate structure 250 comprising a gate dielectric layer 252 and a metallic gate electrode 254, an upper insulating spacer 260, and second (upper) source/drain regions 270 formed on upper surfaces of the vertical semiconductor fins 108-1 and 108-2. The vertical FET device D1 can be fabricated using known techniques such as those described above in conjunction with FIG. 5 for fabrication the vertical FET device D2 of the second device layer L2.

It is to be understood that the methods discussed herein for fabricating vertical field-effect transistor devices for monolithic 3D semiconductor IC devices, can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

I claim:

1. A method, comprising:
    forming a vertical fin structure on a first substrate, wherein the vertical fin structure comprises a first vertical semiconductor fin, a fin insulating spacer disposed on the first vertical semiconductor fin, and a second vertical semiconductor fin disposed on the fin insulating spacer;
    forming a sacrificial layer of insulating material on the first substrate, wherein the sacrificial layer of insulating material encapsulates the first vertical semiconductor fin of the vertical fin structure; and
    forming a first device layer on the sacrificial layer of insulating material, wherein the first device layer comprises a first vertical field-effect transistor device which comprises the second vertical semiconductor fin of the vertical fin structure.

2. The method of claim 1, further comprising:
    bonding a second substrate to the first device layer;
    removing the first substrate to expose the sacrificial layer of insulating material;
    removing the sacrificial layer of insulating material to expose the first vertical semiconductor fin; and
    forming a second device layer over first device layer, wherein the second device layer comprises a second vertical field-effect transistor device which comprises the first vertical semiconductor fin.

3. The method of claim 2, further comprising forming a capping layer on the sacrificial layer of insulating material prior to forming the first device layer, wherein the capping layer is formed of a material that has etch selectivity with respect to the sacrificial layer of insulating material.

4. The method of claim 3, wherein the capping layer is formed of silicon nitride and wherein the sacrificial layer of insulating material is formed of silicon oxide.

5. The method of claim 3, wherein the capping layer is disposed substantially coplanar with the fin insulating spacer disposed between the first and second vertical semiconductor fins.

6. The method of claim 3, wherein removing the sacrificial layer of insulating material to expose the first vertical semiconductor fin comprises performing an etch process to etch the sacrificial layer of insulating material down to the capping layer.

7. The method of claim 1, wherein forming the vertical fin structure on the first substrate comprises:
    forming a first semiconductor layer on the first substrate;
    forming an insulating layer on the first semiconductor layer;
    forming a second semiconductor layer on the insulating layer; and
    patterning the first semiconductor layer, the insulating layer, and the second semiconductor layer down to the first substrate to thereby form the vertical fin structure.

8. The method of claim 1, wherein the first and second vertical semiconductor fins are formed of epitaxial semiconductor material.

9. The method of claim 8, wherein the epitaxial semiconductor material comprises epitaxial silicon.

10. The method of claim 8, wherein the epitaxial semiconductor material comprises an epitaxial silicon-germanium alloy.

11. The method of claim 7, wherein the epitaxial semiconductor material comprises a III-V compound semiconductor material.

12. The method of claim 2, wherein:
    the first vertical field-effect transistor device comprises:
        a first source/drain region disposed at first end of the second vertical semiconductor fin and a second source/drain region disposed at second end of the second vertical semiconductor fin;
        a first source/drain contact disposed surrounding the first source/drain region;
        a first metallic gate structure disposed surrounding the second vertical semiconductor fin; and
        a first insulating spacer layer disposed between the first metallic gate structure and the first source/drain contact; and
    the second vertical field-effect transistor device comprises:
        a third source/drain region disposed at first end of the first vertical semiconductor fin and a fourth source/drain region disposed at second end of the first vertical semiconductor fin;
        a second source/drain contact disposed surrounding the third source/drain region;
        a second metallic gate structure disposed surrounding the first vertical semiconductor fin; and
        a second insulating spacer layer disposed between the second metallic gate structure and the second source/drain contact.

13. The method of claim 12, wherein the first and third source/drain regions comprise doped first ends of the first and second vertical semiconductor fins adjacent to the fin insulating spacer.

14. The method of claim 12, wherein forming the first and second device layers comprises:
  forming a third gate insulating spacer on the first metallic gate structure; and
  forming a fourth gate insulating spacer on the second metallic gate structure.

15. A method, comprising:
  forming an etch stop layer on a first substrate;
  forming a first semiconductor layer on the etch stop layer;
  forming an insulating layer on the first semiconductor layer;
  forming a second semiconductor layer on the insulating layer;
  patterning the first semiconductor layer, the insulating layer, and the second semiconductor layer down to the etch stop layer to thereby form a vertical fin structure comprising a first vertical semiconductor fin, a second vertical semiconductor fin, and a fin insulating spacer disposed between the first and second vertical semiconductor fins;
  forming a sacrificial layer of insulating material on the etch stop layer over the first substrate, wherein the sacrificial layer of insulating material encapsulates the first vertical semiconductor fin of the vertical fin structure;
  forming a capping layer on the sacrificial layer of insulating material; and
  forming a first device layer on the capping layer, wherein the first device layer comprises a first vertical field-effect transistor device which comprises the second vertical semiconductor fin of the vertical fin structure.

16. The method of claim 15, further comprising:
  bonding a second substrate to the first device layer;
  removing the first substrate and the etch stop layer to expose the sacrificial layer of insulating material;
  removing the sacrificial layer of insulating material to expose the first vertical semiconductor fin; and
  forming a second device layer over first device layer, wherein the second device layer comprises a second vertical field-effect transistor device which comprises the first vertical semiconductor fin of the vertical fin structure.

17. The method of claim 15, wherein the capping layer is formed of a material that has etch selectivity with respect to the sacrificial layer of insulating material.

18. The method of claim 17, wherein the capping layer is formed of silicon nitride and wherein the sacrificial layer of insulating material is formed of silicon oxide.

19. The method of claim 15, wherein the capping layer is disposed substantially coplanar with the fin insulating spacer disposed between the first and second vertical semiconductor fins of the vertical fin structure.

20. The method of claim 16, wherein removing the sacrificial layer of insulating material to expose the first vertical semiconductor fin comprises performing an etch process to etch the sacrificial layer of insulating material down to the capping layer.

* * * * *